(12) United States Patent
Kato et al.

(10) Patent No.: US 6,176,373 B1
(45) Date of Patent: *Jan. 23, 2001

(54) EMBOSSED CARRIER TAPE

(75) Inventors: Hiroshi Kato; Tomoyasu Kato; Yasuyuki Takao, all of Saitama; Hiroshi Kase, Fukushima, all of (JP)

(73) Assignees: Shin-Etsu Polymer Co., Ltd.; Nippon Motorola Ltd., both of (JP)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/024,594

(22) Filed: Feb. 17, 1998

(30) Foreign Application Priority Data

Feb. 17, 1997 (JP) .................................. 9-046909

(51) Int. Cl.[7] .................................. B65D 85/90
(52) U.S. Cl. .................................. 206/714
(58) Field of Search .......................... 206/701, 713–717, 206/725

(56) References Cited

U.S. PATENT DOCUMENTS

| | | | |
|---|---|---|---|
| 4,633,370 | * 12/1986 | Hamuro et al. | 206/714 |
| 4,966,281 | * 10/1990 | Kawanishi et al. | 206/714 |
| 5,076,427 | 12/1991 | Thomson et al. | 206/330 |
| 5,136,827 | * 8/1992 | Sawaya | 206/714 |
| 5,152,393 | * 10/1992 | Chenoweth | 206/725 |
| 5,226,226 | 7/1993 | Fierkens | 29/827 |
| 5,234,104 | 8/1993 | Schulte et al. | 206/330 |
| 5,265,723 | 11/1993 | Chenoweth et al. | 206/330 |
| 5,333,733 | 8/1994 | Murata | 206/330 |
| 5,351,821 | * 10/1994 | Skrtic | 206/714 |
| 5,361,901 | * 11/1994 | Schenz et al. | 206/714 |
| 5,390,472 | 2/1995 | Weiler et al. | 53/412 |
| 5,469,962 | * 11/1995 | Kitagawa et al. | 206/725 |
| 5,499,717 | * 3/1996 | Hayashi | 206/714 |
| 5,524,765 | 6/1996 | Gutentag | 206/713 |
| 5,664,680 | 9/1997 | Hamlin | 206/714 |
| 5,667,073 | 9/1997 | Okui | 206/713 |
| 5,913,425 | 6/1999 | Thomas et al. | 206/714 |

FOREIGN PATENT DOCUMENTS

| | | | |
|---|---|---|---|
| 4-367458 | * 12/1992 | (JP) | 206/330 |
| 3001281 | 8/1994 | (JP) | . |
| 8-143094 | 6/1996 | (JP) | . |

* cited by examiner

Primary Examiner—Jim Foster
(74) Attorney, Agent, or Firm—Lerner, David, Littenberg, Krumholz & Mentlik, LLP

(57) ABSTRACT

An embossed carrier tape capable of accurately accomplishing an automatic inspection of leads or the like of an electronic component by means of a camera. The carrier tape is formed with a plurality of receiving recesses in which electronic components are to be received, respectively. The receiving recesses are each formed at a lower portion of each of side surfaces thereof opposite to leads of the electronic component with an inclined surface. Such construction results in the leads being abutted against the inclined surface, to thereby be subjected to positional regulation if the electronic component is undesirably moved during inspection thereof. This permits a reflected image of the leads from the side surface of the receiving recess to be substantially separated from a directly-viewed image thereof during an inspection of the electronic component by image processing using a camera, to thereby ensure accurate judgment of any defect of the electronic component, such as bending of the leads or the like.

19 Claims, 5 Drawing Sheets

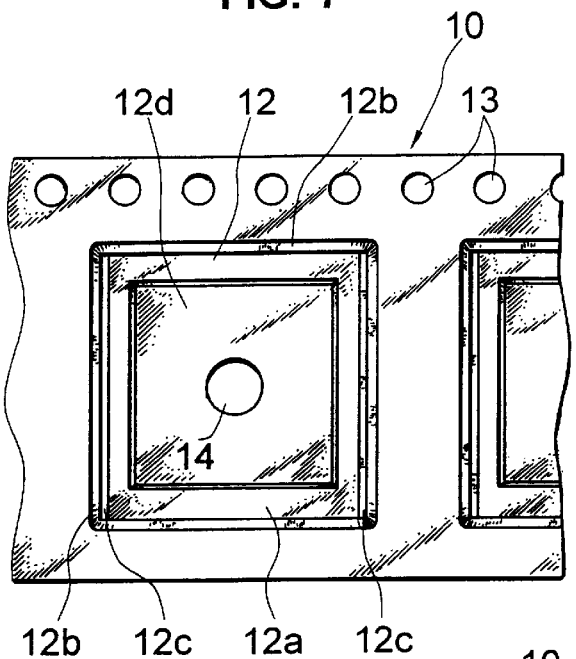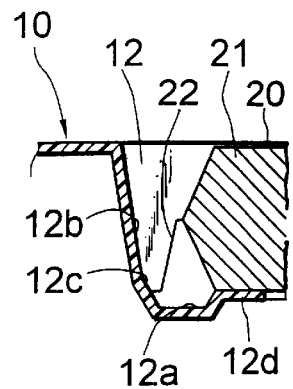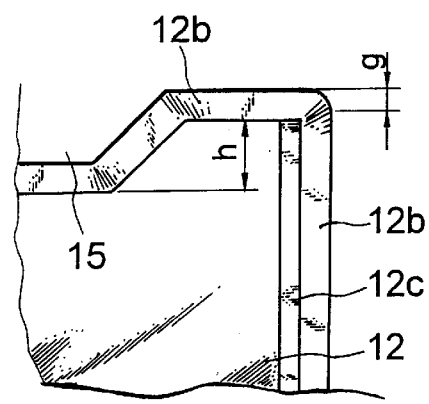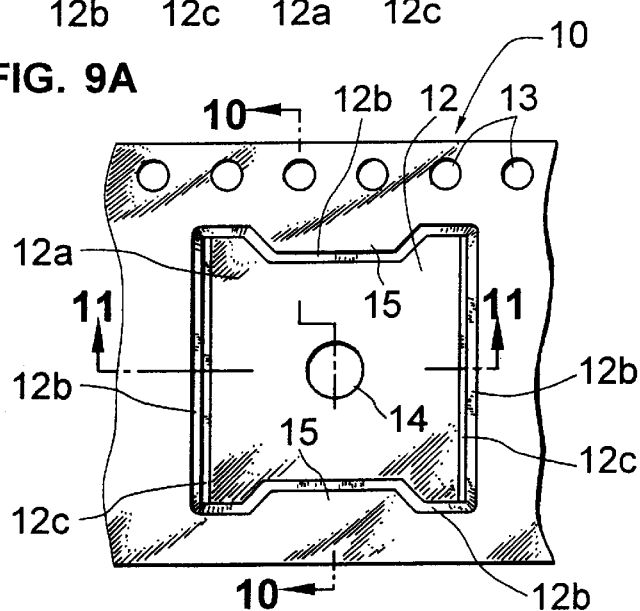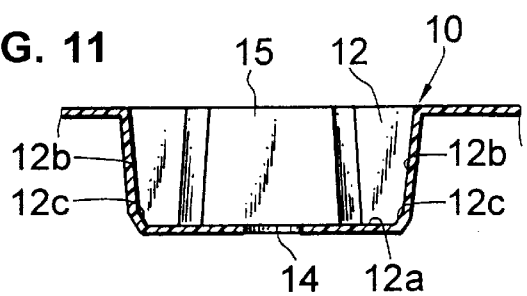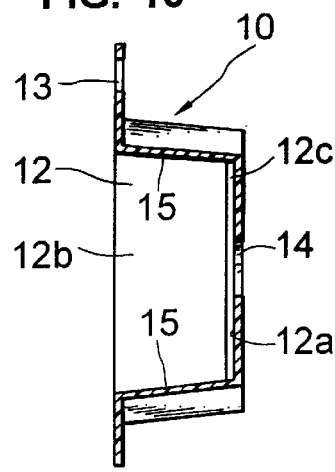

EMBOSSED CARRIER TAPE

BACKGROUND OF THE INVENTION

This invention relates to an embossed carrier tape suitable for use for feeding of electronic components to an electronic component mounting apparatus, transportation of the components, storage thereof or the like while receiving them in receiving recesses formed on the tape in a manner to be spaced from each other at predetermined intervals in a longitudinal direction of the embossed carrier tape, and more particularly to an embossed carrier tape which permits an image of each of electronic components received in the receiving recesses of the tape to be picked up by a camera, resulting in a signal of the picked-up image generated from the camera being processed, leading to inspection of bending or deformation of leads of each of the electronic components or the like.

A package for an electronic component such as a semiconductor package or the like has conventionally used a packaging material such as a paper tape, a magazine, a tray, an embossed carrier tape (hereinafter also referred to as "carrier tape") or the like. In recent years, the carrier tape has been predominantly used for this purpose because it permits mounting of the electronic components to be accomplished with increased efficiency and facilitates handling of the electronic components. In particular, a progress in reducing a size of an IC package for a semiconductor device and arrangement thereof at fine pitches leads to predominant use of the carrier tape for the package.

The carrier tape is formed by subjecting a thermoplastic resin material such as polystyrene, polyvinyl chloride, amorphous polyester, polycarbonate, polypropylene, polyethylene terephthalate or the like to any suitable forming treatment such as press forming, vacuum forming, pressure forming, vacuum-pressure forming, pressure plugassist forming or the like to provide receiving recesses in which electronic components are to be received. During charging of the electronic components in the receiving recesses of the carrier tape thus formed, the electronic components are subjected to an inspection of a function or performance of the electronic components such as electric properties thereof and the like and a visual inspection for inspecting an appearance of the electronic components such as any defect or deficiency of the electronic components, any marking on a surface of the components or the like. Thereafter, the electronic components are received in the receiving recesses of the carrier tape and then a top tape is adhered to the carrier tape to close an opening of each of the receiving recesses. Then, a final inspection is carried out on the carrier tape prior to shipping, to thereby visually inspect a direction or posture of insertion of the electronic components into the receiving recesses of the carrier tape, inclusion of any improper electronic components into the carrier tape, a production lot of the electronic components, any marking on the components, lack of the components required, deformation of leads of the components and the like.

Unfortunately, each of the visual inspections described above necessarily or inevitably depends on inspector's individual judgment. Such individual judgment tends to be varied in criteria and readily cause an error, and requires a lot of inspection steps. Also, it substantially fails to accurately or satisfactorily inspect a small-sized semiconductor package in which leads are arranged at reduced pitches, because it is visually carried out. In view of the foregoing, it has been recently attempted to automatically carry out each of the visual inspection prior to adhesion of the top tape to the carrier tape and the final visual inspection by means of an inspection unit using a camera or the like and, as a result, such an automatic inspection has been partially put into practice.

More particularly, such an inspection unit as described above is generally constructed in such a manner that light emitted from a light emitting diode (LED), an optical fiber or the like is downwardly irradiated on the electronic components in the receiving recesses of the carrier tape and then an image of the electronic components is picked up by means of a CCD camera or the like, resulting in the CCD camera generating a signal of the thus picked-up image or an imaging signal. Then, the imaging signal thus generated is used for image processing such as binary processing, gray scale pattern matching or the like, so that any marking on an upper surface of the electronic components, deformation of the leads and the like may be inspected.

In the conventional carrier tape described above, the receiving recesses are formed into a size somewhat greater than that of the electronic components, to thereby facilitate insertion of the electronic components into the receiving recesses and removal of the former from the latter. Also, the receiving recesses of the carrier tape are each formed on a side surface thereof with an inclination or draft for facilitating removal of the receiving recesses from a forming die after forming of the recesses. Further, the leads of each of the electronic components are each formed at distal ends thereof with a flat portion, of which an upper surface highly reflects light. Moreover, lighting obtained by the inspection unit during the inspection tends to be reduced on a periphery of a bottom surface side of the electronic components as compared with an upper surface thereof. Thus, inspection by the inspection unit, prior to adhesion of the top tape to the carrier tape, in which insertion of the electronic components into the receiving recesses of the carrier tape are carried out results in a failure; because when the electronic components are received in the receiving recesses in a manner to be deviated from a correct position or in a wrong posture due to undesirable movement of the electronic components therein, resulting in the leads of the electronic components being abutted at distal ends thereof against the side surface of the receiving recesses, a reflected image of the leads occurs from the side surface of the receiving recesses in a manner to be contiguous to a directly-viewed image thereof. This causes image processing of the imaging signal of the camera to fail in accurate recognition or identification of the leads, leading to a failure in inspection of the leads of the electronic components.

In order to solve the problem, a carrier tape which is constructed so as to have a certain roughness of an inner surface of receiving recesses has been proposed as disclosed in Japanese Utility Model Registration No. 3,001,281. Another carrier tape has also been proposed which is constructed so as to provide a coating layer on an inner surface of receiving recesses to reduce glossiness of the inner surface to a level of 50 or less, as disclosed in Japanese Patent Application Laid-Open Publication No. 143094/1996. Unfortunately, such proposed carrier tapes each fail to fully solve the problem.

SUMMARY OF THE INVENTION

The present invention has been made in view of the foregoing disadvantages of the prior art.

Accordingly, it is an object of the present invention to provide a carrier tape which is capable of accurately accomplishing an automatic inspection of leads of an electronic component by means of a camera.

In accordance with the present invention, an embossed carrier tape is provided. The embossed carrier tape is formed with a plurality of receiving recesses each having a substantially rectangular parallelopiped shape and arranged so as to be spaced from each other at predetermined intervals in a longitudinal direction of the embossed carrier tape so that the receiving recesses are adapted to receive lead-equipped electronic components therein, respectively. The receiving recesses are each formed at a lower portion of each of first side surfaces thereof opposite to leads of the electronic component with a respective inclined surface. The inclined surface is arranged so as to intersect a bottom surface of the receiving recess with an obtuse angle defined therebetween and formed so as to be inclined with respect to the bottom surface at the obtuse angle greater than an angle defined between a respective one of the first side surfaces and the bottom surface.

In the present invention thus constructed, the electronic components received in the receiving recesses of the carrier tape permits a gap of a significant size to be formed between distal ends of the leads and the side surface of the receiving recess when the distal ends of the leads is abutted against the inclined surface of the receiving recess. This, when an image of the electronic component received in the receiving recess is picked up by a camera, permits a gap of a significant size to be formed between a directly-viewed image of the leads and a reflected image from the side surface of the receiving recess in the image of the leads picked up, to thereby ensure effective identification of the distal ends of the leads, resulting in bending of the leads or the like being accurately judged.

In a preferred embodiment of the present invention, the receiving recesses are each formed on each of second side surfaces thereof opposite to each other with a positioning projection for positioning a body of a respective one of the electronic components in the receiving recess. Such construction permits the body of the electronic component received in the receiving recess to be positionally regulated in a width direction of the carrier tape by the positioning projections. This, even when the electronic component is undesirably moved during an inspection thereof, effectively prevents outermost leads arranged on ends of the electronic component from being positioned at curved portions of corners of the receiving recess, so that the outermost leads may be accurately inspected. More specifically, a forming die for the carrier tape is generally restricted in working accuracy and formability, so that the corners of each of the receiving recesses of the carrier tape are each inevitably formed with the curved portion. Nevertheless, the carrier tape of the present invention permits the electronic component to be positionally regulated by the positioning projections on the second side surfaces of the receiving recess, so that the outermost leads may each be out of the curved portion. This results in the reflected image and directly-viewed image being separated from each other, to thereby permits the outermost leads to be accurately identified or recognized. The positioning projection is so formed that a horizontal distance projected from the corresponding side surface is greater than a horizontal dimension of the curved portion of each of the corners of the receiving recess which is defined as viewed in plan. The horizontal distance of the positioning projection is preferably less than 1 mm.

In a preferred embodiment of the present invention, the receiving recesses are each also formed at a lower portion of each of the second side surfaces with an inclined surface in such a manner similar to that of the first side surfaces.

In a preferred embodiment of the present invention, the bottom surface of each of the receiving recesses is formed on a central portion thereof with a bed in a manner to be upwardly raised therefrom to support a respective one of the electronic components thereon.

In a preferred embodiment of the present invention, the inclined surface is so formed that a horizontal dimension thereof in an inward direction as viewed in plan is within a range of 0.1 to 1.0 mm. The horizontal dimension is preferably within a range of 0.2 to 0.4 mm.

The electronic component are provided with leads so as to be led out of two sides of the component opposite to each other or four sides thereof and is typically represented by a semiconductor package such as a small outline package (SOP), a quad flat package (QFP) or the like.

BRIEF DESCRIPTION OF THE DRAWINGS

These and other objects and many of the attendant advantages of the present invention will be readily appreciated as the same becomes better understood by reference to the following detailed description when considered in connection with the accompanying drawings in which like reference numerals designate like or corresponding parts throughout; wherein:

FIG. 7 is a fragmentary enlarged plan view showing an essential part of another modification of the carrier tape of FIG. 1;

FIG. 8 is a fragmentary sectional view of FIG. 7;

FIG. 9A is a fragmentary plan view showing an essential part of another embodiment of a carrier tape according to the present invention;

FIG. 9B is a fragmentary enlarged plan view of FIG. 9A;

FIG. 10 is a sectional view taken along line 10—10 of FIG. 9A;

FIG. 11 is a sectional view taken along line 11—11 of FIG. 9A;

DETAILED DESCRIPTION OF THE PREFERRED EMBODIMENTS

Figure 1:
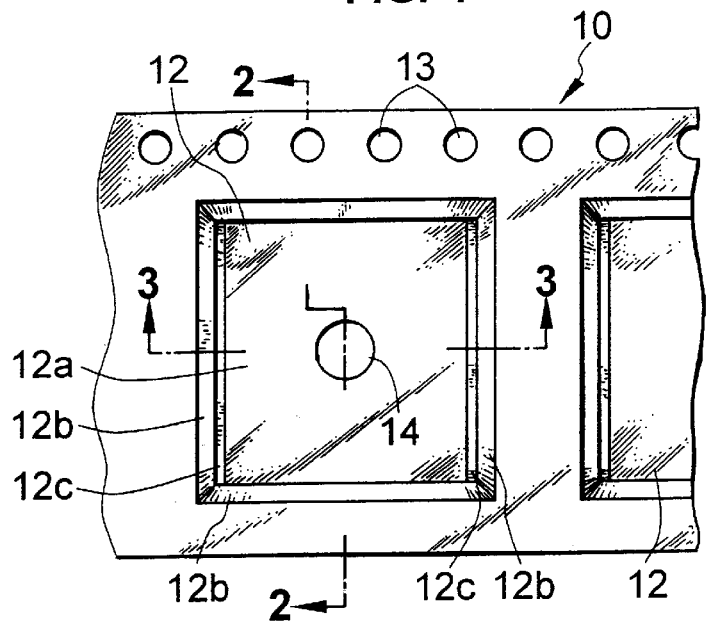
FIG. 1 is a fragmentary plan view showing an essential part of an embodiment of a carrier tape according to the present invention.
Figure 2:
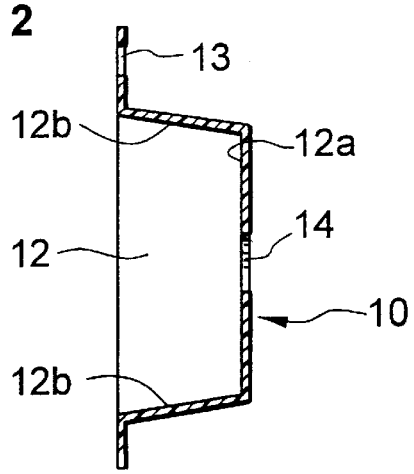
FIG. 2 is a sectional view taken along line 2—2 of FIG. 1.
Figure 3A:
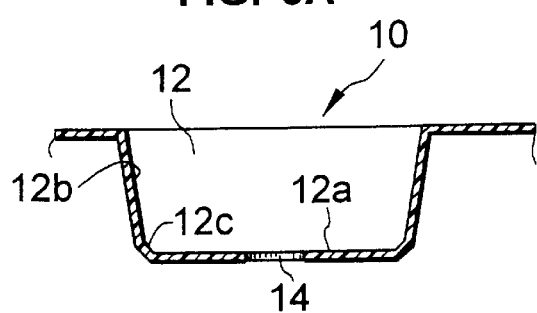
FIG. 3A is a sectional view taken along line 3—3 of FIG. 1.
Figure 3B:
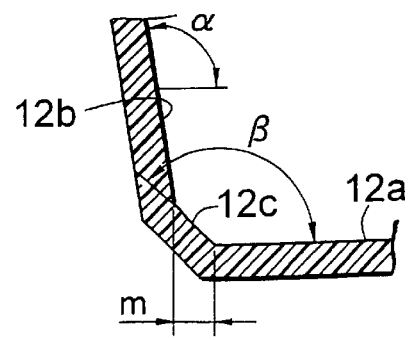
FIG. 3B is a fragmentary enlarged view of FIG. 3A.

Now, an embossed carrier tape according to the present invention will be described hereinafter with reference to the accompanying drawings.

Referring first to FIGS. 1 to 5B, an embodiment of a carrier tape according to the present invention is illustrated, wherein reference numeral 10 designates a carrier tape of the illustrated embodiment and 20 designates an electronic component. The carrier tape 10 is formed with a plurality of receiving recesses 12 each of which has an opening defined on one surface of the carrier tape or an upper surface thereof. The receiving recesses 12 are arranged in a row so as to be spaced from each other at predetermined intervals in a longitudinal direction of the carrier tape 10 and are adapted to receive the electronic components 20 therein, respectively. The carrier tape 10 has a top tape (not shown) adhered to the opening-side surface or upper surface thereof while holding the electronic components 20 received in the respective receiving recesses 12, so that the opening of each of the receiving recesses 12 may be closed. Reference numeral 13 designates sprocket perforations formed in a row on one side of the carrier tape 10 in a manner to be spaced from each other at predetermined intervals in a longitudinal direction of the carrier tape 10.

Figure 4:
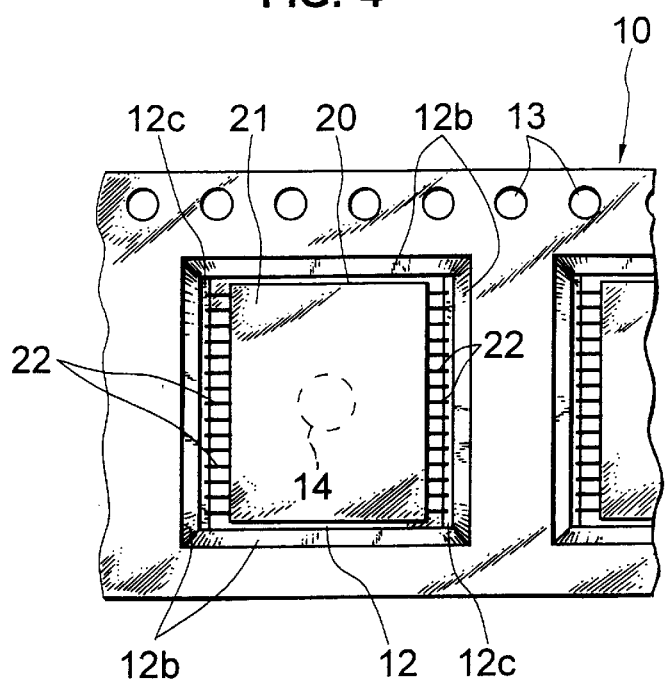
FIG. 4 is a fragmentary plan view showing an essential part of the carrier tape of FIG. 1.
Figure 5A:
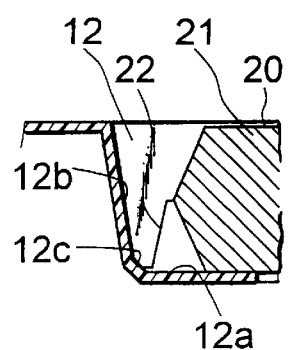
FIG. 5A is a fragmentary enlarged sectional view of FIG. 4.
Figure 5B:
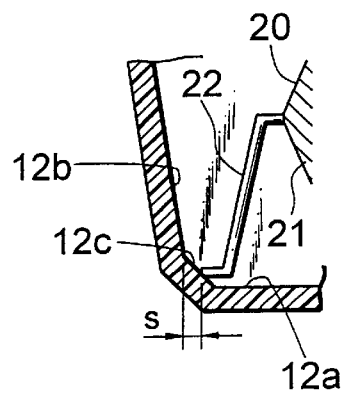
FIG. 5B is a fragmentary enlarged view of FIG. 5A.

In the illustrated embodiment, the electronic components 20, as shown in FIGS. 4, 5A and 5B, each are in the form of an SOP semiconductor package and include a component body 21, which is provided on each of a pair of opposite side surfaces thereof with a plurality of leads 22 in a manner to outwardly extend therefrom. The body 21 is made of resin by molding and the leads 22 are each bent at a distal end thereof into a hook-like shape. The electronic components 20 are each received in a respective one of the receiving recesses 12 while keeping the leads 22 orientated in the longitudinal direction of the carrier tape 10, so that movement of the electronic component 20 permits the leads 22 to be abutted at distal ends thereof against an inclined surface of the receiving recess 12 which will be described hereinafter. The electronic components 20 may be received in the respective receiving recesses 12 while keeping the leads 22 oriented in a width direction of the carrier tape 10.

The receiving recesses 12 are each formed with a substantially rectangular parallelopiped shape, resulting in having a bottom surface 12a of a square shape and four side surfaces 12b upwardly extending from four sides of the bottom surface 12a, respectively. Also, the receiving recesses 12 each include an inclined surface 12c defined between each of a pair of opposite sides extending in a width direction of the bottom surface 12a and a corresponding one of the side walls 12b. Reference numeral 14 designates a detection hole formed in the bottom surface 12a of each of the receiving recesses 12 to permit the electronic component to be detected therethrough.

The receiving recesses 12 are each constructed in such a manner that the side surfaces 12b are each inclined at an angle α somewhat greater than 90° such as, for example, about 93° to 95° with respect to the bottom surface 12a and the inclined surfaces 12c are each inclined at an obtuse angle β greater than the above-described angle α with respect to the bottom surface 12a. The inclined surface 12c is so formed that a horizontal width m (FIG. 3B) thereof as viewed in plan is within a range of between 0.1 mm and 1.0 mm and preferably between 0.2 mm and 0.4 mm. Further, it is preferable that a boundary between each of the inclined surfaces 12c and the respective one of the side surfaces 12b be formed at a position higher by 0.2 to 0.7 mm and preferably 0.2 to 0.4 mm than the distal ends of the leads 22 of the electronic component 20.

The carrier tape 10 of the illustrated embodiment is adapted to have the electronic components 20 inserted into the respective receiving recesses 12 after an inspection of a function of the electronic components is carried out, followed by adhesion of a top tape thereto. The electronic components 20 received in the respective receiving recesses 12 are subjected to, before and/or after adhesion of the top tape, image pickup by means of a CCD camera while being irradiated with light emitted from an LED or the like to carry out such a visual inspection or a final inspection as described above in connection with the prior art. The CCD camera generates an imaging signal, which is processed, resulting in whether or not any defect of the electronic component, such as bending of the leads 22 being judged.

Each of the electronic components 20 received in the receiving recesses 12 of the carrier tape 10, as shown in FIGS. 5A and 5B, permit a gap s of a significant size (FIG. 5B) to be formed between the distal ends of the leads 22 and the side surface 12b of the receiving recess 12 when the distal ends of the leads 22 are abutted against the inclined surface 12c of the receiving recess 12. This, when an image of the electronic component 20 received in the receiving recess 12 is picked up by the CCD camera, permits a gap of a significant size to be formed between a directly-viewed image of the leads 22 in the image of the leads picked up and a reflected image thereof from the side surface 12b of the receiving recess 12 therein, to thereby ensure effective identification of the distal ends of the leads 22, resulting in bending of the leads 22 or the like being accurately judged.

Figure 6:
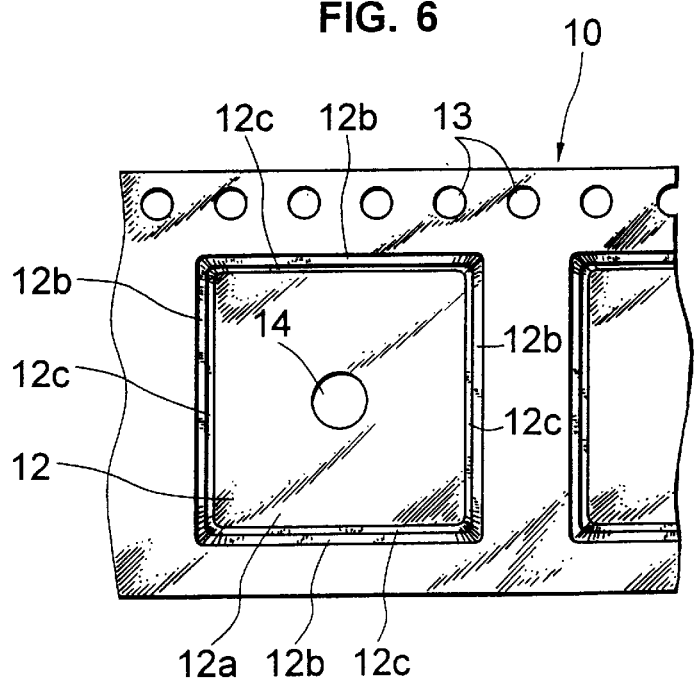
FIG. 6 is a fragmentary plan view showing a modification of the carrier tape of FIG. 1.

The illustrated embodiment has been described in connection with application to the electronic component 20 which has the leads 22 arranged so as to extend from a pair of opposite sides of the body 21 of the electronic component 20. However, the illustrated embodiment may be of course applied to an electronic component which is constructed so as to have leads arranged on a body thereof in a manner to extend from all of four sides of the body. In this instance, as shown in FIG. 6, the inclined surface 12C may be formed on each of the four all sides of the bottom surface 12a of each of the receiving recesses 12. Also, in the carrier tape 10 of the illustrated embodiment, the bottom surface 12a of each of the receiving recesses 12 is formed into a flat shape. However, the illustrated embodiment is not limited to such a construction.

Referring now to FIGS. 7 and 8, a modification of the embodiment described above with reference to FIGS. 1 to 5B is illustrated. A carrier tape of the modification is so constructed that a bottom surface 12a of each of receiving recesses 12 is formed on a central portion thereof with a bed 12d in a manner to be upwardly raised therefrom, on which a body 21 of an electronic component 20 is supported.

Referring now to FIGS. 9A to 12, another embodiment of a carrier tape according to the present invention is illustrated. A carrier tape 10 of the illustrated embodiment is so constructed that a pair of side surfaces 12b of each of receiving recesses 12 defined in a longitudinal direction of the carrier tape 10, which are other than the above-described side surfaces 12b opposite to the leads 22 of the electronic component 20, are each formed with a positioning projection 15. The positioning projections 15 of each of the receiving recesses 12 are formed integrally with the respective side surfaces 12b of the receiving recess 12 by inwardly expanding the side surface 12b, so that the body 21 of the electronic component 20 received in a respective one of the receiving recesses 12 may be kept from being affected by corners of the receiving recess 12 during an inspection of the electronic component 20. The positioning projection 15, as shown in FIG. 9B, is so constructed that a dimension or horizontal distance h of expansion thereof projected from the corresponding side surface 12b is greater than a horizontal dimension g of a curved portion of each of corners of the receiving recess 12 which is defined as viewed in plan and is 1 mm or less.

Such construction of the illustrated embodiment permits the body 21 of the electronic component 20 received in the receiving recess 12 to be positionally regulated in a width direction of the carrier tape 20 by the positioning projections 15. This, even when the electronic component 20 is undesirably moved during an inspection thereof, effectively prevents endmost or outermost leads 22h of the electronic component 20 from being positioned at the curved portions 12h of the corners of the receiving recess 12, so that the leads 22h may be accurately inspected.

Figure 12:
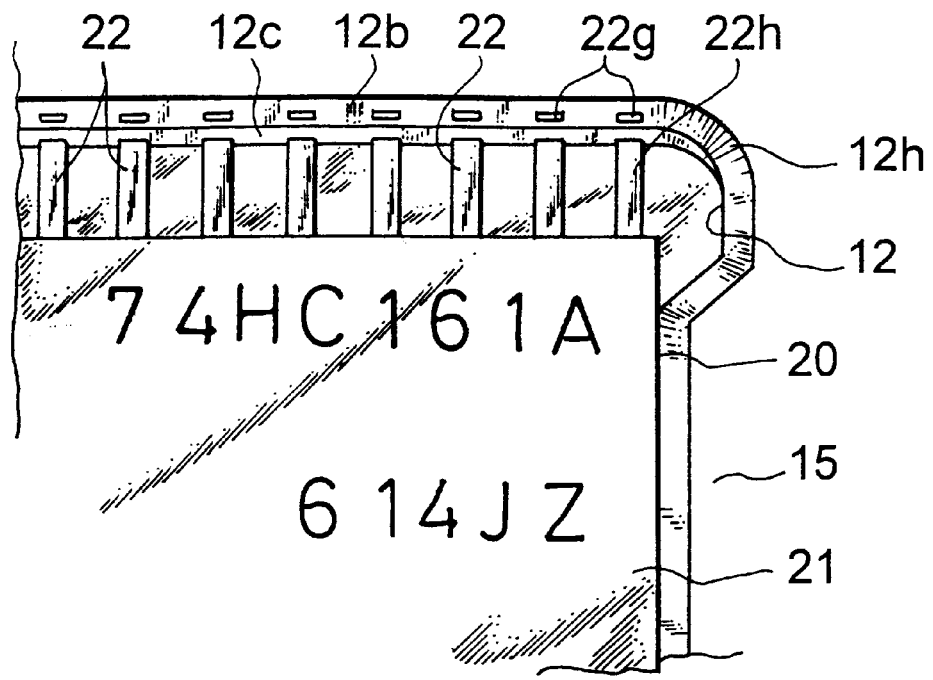
FIG. 12 is a fragmentary enlarged plan view showing a function of the carrier tape of FIG. 9A.
Figure 13:
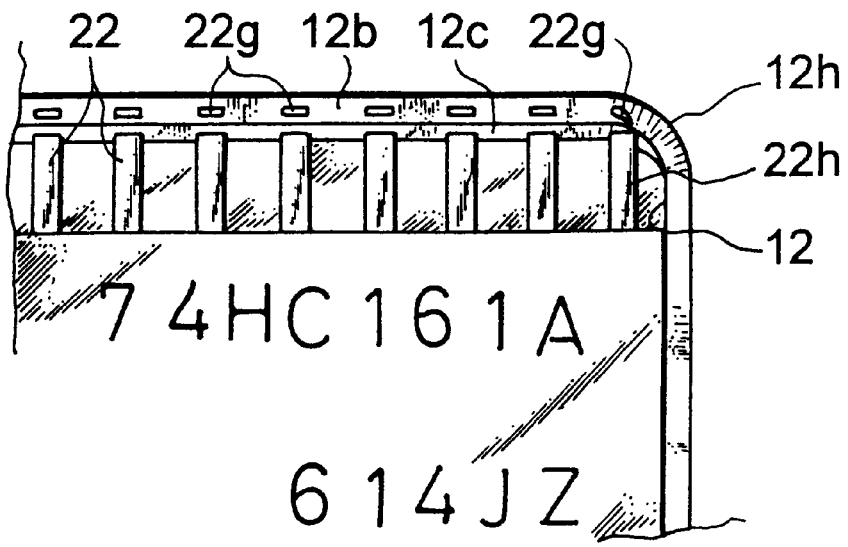
FIG. 13 is a fragmentary enlarged plan view showing a function of a comparative example of a carrier tape which is free of any positioning projection.

More particularly, a forming die for the carrier tape 10 is generally restricted in working accuracy and formability, so that the corners of each of the receiving recesses 12 of the carrier tape 10 are each inevitably formed with the curved portion 12h as shown in FIGS. 12 and 13. Thus, in a carrier tape which is free of any positioning projection, extension of each of the outermost leads 22h toward the curved portion 12h, as shown in FIG. 13, causes a reflected image 22g of the lead 22h to be formed at a position in proximity to the lead 22h, resulting in processing of a signal of a picked-up image from a camera failing to distinguish the reflected image 22g and a directly-viewed image of the lead 22h from each other. On the contrary, the carrier tape of the illustrated embodiment, as shown in FIG. 12, permits the electronic component 20 to be positionally regulated by the positioning projections 15 on the side surfaces 12b of the receiving recess 12, so that each of the outermost leads 22h may be out of the curved portion 12h. This results in the reflected image and directly-viewed image of the outermost lead 22h being separated from each other, to thereby permit the lead 22h to be accurately identified or recognized.

Figure 14:
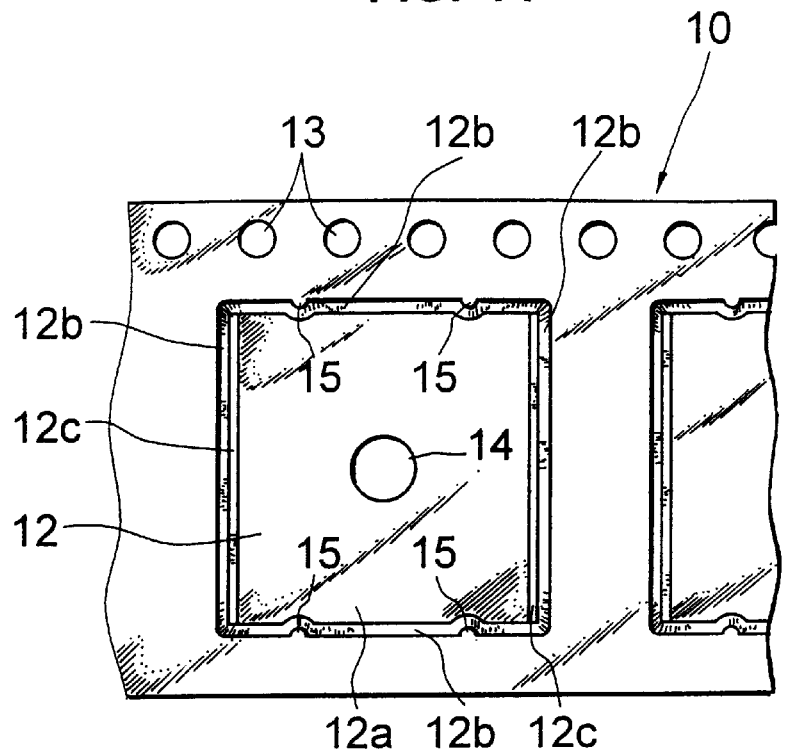
FIGS. 14 and 15 each are a fragmentary plan view showing another modification of the carrier tape of FIG. 9A.
Figure 15:
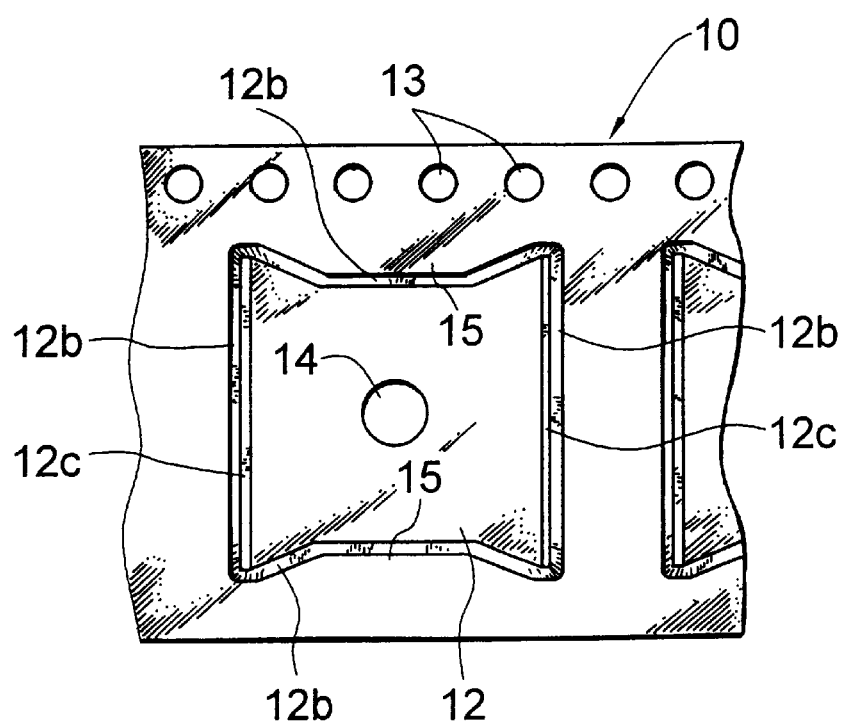

The positioning projection 15 is not limited to such a configuration as employed in the illustrated embodiment. It may be formed into any other suitable configuration as shown in, for example, FIGS. 14 and 15.

Also, in the illustrated embodiment, a bottom surface 12a of each of the receiving recesses 12 of the carrier tape 10 is formed into a flat shape. Alternatively, it may be formed thereon with a bed like the bed 12d shown in FIG. 8.

As can be seen from the foregoing, the carrier tape of the present invention is constructed in the manner that the receiving recesses in which the electronic components are to be received are each formed at the lower portion of each of the side surfaces thereof opposite to the leads of the electronic component with the inclined surface. Such construction results in the leads being abutted against the inclined surface, to thereby be subjected to positional regulation if the electronic component is undesirably moved during inspection thereof. This permits a reflected image of the leads from the side surface of the receiving recess to be substantially separated from a directly-viewed image thereof during an inspection of the electronic component by image processing using a camera, to thereby ensure accurate judgment of any defect of the leads such as bending of the leads or the like.

Also, when the carrier tape of the present invention is so constructed that the receiving recesses are each formed on each of the other side surfaces thereof with the projection for positioning the body of a respective one of the electronic components, the outermost leads of the electronic component may be accurately inspected by image processing.

The invention will be understood more readily with reference to the following examples and comparative examples; however, these examples are intended to illustrate the invention and are not to be construed to limit the scope of the invention.

EXAMPLE 1

An embossed carrier tape of the present invention was made of a molded sheet of 0.3 mm in thickness formed of conductive grade #137800D-20 PVC commercially available from Shin-Etsu Polymer CO., LTD. The carrier tape thus formed was 16 mm in width thereof, 12 mm in pitch between receiving recesses thereof, 8.2 mm×5.7 mm in size of the receiving recess, 2.1 mm in inner depth of the receiving recess and 0.25 mm in horizontal dimension of each of inclined surfaces of the receiving recess as viewed in plan. The angle β was 135°. The carrier tape corresponded to such an embossed carrier tape as shown in FIGS. 4 to 5B for a lead-equipped electronic component.

COMPARATIVE EXAMPLE 1

An embossed carrier tape for comparison which is substantially identical with that of Example 1 described above was made expect that it was free of any inclined surface.

The carrier tapes obtained by Example 1 and Comparative Example 1 were subjected to a test for identification of leads by image processing. It was found that the carrier tape of Example 1 permits the leads to be readily identified, whereas that of Comparative Example 1 causes a reflected image of outermost leads to be deformed and close to a directly-viewed image thereof, resulting in a combination of the directly-viewed image and reflected image being frequently mistaken for the leads.

EXAMPLE 2

Example 1 was substantially. repeated to make an embossed carrier tape of the present invention substantially identical as that of Example 1. The embossed carrier tape was further formed on a bottom surface of each of receiving recesses thereof with a bed of 0.3 mm in height. Also, the receiving recesses were each formed with inclined surfaces of 0.25 mm in horizontal dimension as viewed in plan and 117° in angle β. The embossed carrier tape thus obtained corresponded to that shown in FIGS. 7 and 8.

COMPARATIVE EXAMPLE 2

An embossed carrier tape for comparison which is substantially identical with that of Example 2 described above was made expect that it was free of any inclined surface.

The carrier tapes obtained in both Example 2 and Comparative Example 2 were subjected to a test for identification of leads by image processing. As a result, it was found that the carrier tape of Example 2 permits image processing of the leads to be successfully attained, whereas that of Comparative Example 2 causes a reflected image of outermost leads to be close to a directly-viewed image thereof, resulting in a combination of the directly-viewed image and reflected image being frequently mistaken for the leads as in Comparative Example 1.

EXAMPLE 3

Example 1 was substantially repeated to make an embossed carrier tape of the present invention substantially identical with that of Example 1, except that receiving recesses thereof are each curved at corners thereof with a radius of 0.3 mm. Also, the receiving recess is formed on a central portion of each of a pair of opposite side surfaces thereof with a positioning projection of 4.0 mm in length and 0.3 mm in expansion or width. The embossed carrier tape thus obtained corresponded to that shown in FIGS. 9A to 11.

COMPARATIVE EXAMPLE 3

An embossed carrier tape for comparison which is substantially identical with that of Example 3 described above was made expect that it was free of any positioning projection.

The carrier tapes obtained in both Example 3 and Comparative Example 3 were subjected to a test for identification of leads by image processing. As a result, it was found that the carrier tape of Example 3 permits image processing of the leads to be successfully attained, whereas that of Comparative Example 3 causes a reflected image of outermost leads to be close to a directly-viewed image thereof, resulting in a combination of the directly-viewed image and reflected image being frequently mistaken for the leads.

While preferred embodiments of the invention have been described with a certain degree of particularity with reference to the drawings, obvious modifications and variations are possible in light of the above teachings. It is therefore to be understood that within the scope of the appended claims, the invention may be practiced otherwise than as specifically described.

What is claimed is:

1. An embossed carrier tapes comprising:
   a plurality of receiving recesses, said receiving recesses each having a substantially rectangular parallelopiped shape and arranged so as to be spaced from each other at predetermined intervals in a longitudinal direction of said embossed carrier tape, said receiving recesses being adapted to receive lead-equipped electronic components therein;
   said receiving recesses each having a bottom surface, first side surfaces, and inclined surfaces extending from said bottom surface to a lower portion of said first side surfaces, said inclined surfaces being opposite to leads of the electronic component;
   said inclined surface being adapted to provide a gap between an image of the leads and a reflected image of the leads on said side surface when said images are viewed from above said recess, said inclined surface being arranged so as to intersect said bottom surface of said receiving recess with an obtuse angle defined therebetween, said inclined surface being inclined with respect to said bottom surface at said obtuse angle greater than an angle defined between a respective one of said first side surfaces and said bottom surface.

2. An embossed carrier tape as defined in claim 1, wherein said receiving recesses are each formed on each of second side surfaces thereof opposite to each other with a positioning projection for positioning a body of a respective one of the electronic components in said receiving recess.

3. An embossed carrier tape as defined in claim 2, wherein said positioning projection is so formed that a horizontal distance projected from the corresponding side surface is greater than a horizontal dimension of a curved portion of each of corners of said receiving recess.

4. An embossed carrier tape as defined in claim 1, wherein said receiving recesses are each also formed at a lower portion of each of second side surfaces with an inclined surface in such a manner similar to that of said first side surfaces.

5. An embossed carrier tape as defined in claim 1, wherein said bottom surface of each of said receiving recesses is formed on a central portion thereof with a bed in a manner to be upwardly raised therefrom to support a respective one of the electronic components thereon.

6. An embossed carrier tape as defined in claim 2, wherein said bottom surface of each of said receiving recesses is formed on a central portion thereof with a bed in a manner to be upwardly raised therefrom to support a respective one of the electronic components thereon.

7. An embossed carrier tape as defined in claim 3, wherein said bottom surface of each of said receiving recesses is formed on a central portion thereof with a bed in a manner to be upwardly raised therefrom to support a respective one of the electronic components thereon.

8. An embossed carrier tape as defined in claim 4, wherein said bottom surface of each of said receiving recesses is formed on a central portion thereof with a bed in a manner to be upwardly raised therefrom to support a respective one of the electronic components thereon.

9. An embossed carrier tape as defined in claim 1, wherein said inclined surface is so formed that a horizontal dimension thereof in an inward direction as viewed in plan is within a range of 0.1 to 1.0 mm.

10. An embossed carrier tape as defined in claim 2, wherein said inclined surface is so formed that a horizontal dimension thereof in an inward direction as viewed in plan is within a range of 0.1 to 1.0 mm.

11. An embossed carrier tape as defined in claim 3, wherein said inclined surface is so formed that a horizontal dimension thereof in an inward direction as viewed in plan is within a range of 0.1 to 1.0 mm.

12. An embossed carrier tape as defined in claim 4, wherein said inclined surface is so formed that a horizontal dimension thereof in an inward direction as viewed in plan is within a range of 0.1 to 1.0 mm.

13. An embossed carrier tape as defined in claim 5, wherein said inclined surface is so formed that a horizontal dimension thereof in an inward direction as viewed in plan is within a range of 0.1 to 1.0 mm.

14. An embossed carrier tape, comprising:
    a plurality of receiving recesses, said receiving recesses each having a substantially rectangular parallelopiped shape and arranged so as to be spaced from each other at predetermined intervals in a longitudinal direction of said embossed carrier tape, said receiving recesses being adapted to receive lead-equipped electronic components therein, respectively;
    said receiving recesses each having a bottom surface, side surfaces, and inclined surfaces, said side surfaces being inclined with respect to said bottom surface of said receiving recess so as to diverge toward an opening of said receiving recess;
    said side surfaces including two first side surfaces, said inclined surfaces extending from said bottom surface to a lower portion of said first side surfaces and being opposite to leads of the electronic component;
    said inclined surface being adapted to provide a gap between an image of the leads and a reflected image of the leads on from said side surface when said images are viewed from above said recess, said inclined surface being arranged so as to intersect said bottom surface of said receiving recess at an obtuse angle defined therebetween, said inclined surface being inclined with respect to said bottom surface at said obtuse angle greater than an angle defined between a respective one of said first side surfaces and said bottom surface.

15. An embossed carrier tape as defined in claim 14, wherein said receiving recesses are each formed on each of two second side surfaces of said side surfaces opposite to each other with a positioning projection for positioning a body of a respective one of the electronic components in said receiving recess.

16. An embossed carrier tape as defined in claim 15, wherein said positioning projection is so formed that a horizontal distance projected from the corresponding side surface is greater than a horizontal dimension of a curved portion of each of corners of said receiving recess.

17. An embossed carrier tape as defined in claim 14, wherein said receiving recesses are each also formed at a lower portion of each of second side surfaces with an inclined surface in a manner similar to that of said first side surfaces.

18. An embossed carrier tape as defined in claim 14, wherein said bottom surface of each of said receiving recesses is formed on a central portion thereof with a bed in a manner to be upwardly raised therefrom to support a respective one of the electronic components thereon.

19. An embossed carrier tape as defined in claim 14, wherein said inclined surface is so formed that a horizontal dimension thereof in an inward direction as viewed in plan is within a range of 0.1 to 1.0 mm.

* * * * *

UNITED STATES PATENT AND TRADEMARK OFFICE
CERTIFICATE OF CORRECTION

PATENT NO. : 6,176,373 B1
DATED : January 23, 2001
INVENTOR(S) : Kato et al.

It is certified that error appears in the above-identified patent and that said Letters Patent is hereby corrected as shown below:

Column 1,
Line 36, "plugassist" should read -- plug-assist --

Column 9,
Line 23, "carrier tapes" should read -- carrier tape, --

Signed and Sealed this

Sixth Day of November, 2001

Attest:

NICHOLAS P. GODICI
*Attesting Officer*    *Acting Director of the United States Patent and Trademark Office*